(12) United States Patent
Kaya et al.

(10) Patent No.: US 8,304,774 B2
(45) Date of Patent: Nov. 6, 2012

(54) TRANSISTOR AND METHOD FOR FABRICATING THE SAME

(75) Inventors: Shusuke Kaya, Tokyo (JP); Nariaki Ikeda, Tokyo (JP); Jiang Li, Tokyo (JP)

(73) Assignee: Furukawa Electric Co., Ltd., Tokyo (JP)

( * ) Notice: Subject to any disclaimer, the term of this patent is extended or adjusted under 35 U.S.C. 154(b) by 297 days.

(21) Appl. No.: 12/705,112

(22) Filed: Feb. 12, 2010

(65) Prior Publication Data

US 2011/0198669 A1    Aug. 18, 2011

(51) Int. Cl.
    *H01L 29/04* (2006.01)
(52) U.S. Cl. ............ 257/59; 257/57; 257/60; 257/64; 257/66; 257/70; 438/149; 438/151; 438/157
(58) Field of Classification Search ............ None
    See application file for complete search history.

(56) References Cited

U.S. PATENT DOCUMENTS

2003/0193056 A1* 10/2003 Takayama et al. ............ 257/79

FOREIGN PATENT DOCUMENTS

| JP | 2004-186679 | 7/2004 |
| JP | 2004-247709 | 9/2004 |
| JP | 2005-183551 | 7/2005 |

* cited by examiner

*Primary Examiner* — Kyoung Lee
(74) *Attorney, Agent, or Firm* — Turocy & Watson, LLP

(57) ABSTRACT

The invention provides a transistor having a leak current between a source and drain in a nitride compound semiconductor formed on a substrate that is reduced. A gate electrode, a source electrode and a drain electrode are formed respectively on the surface of the nitride compound semiconductor formed on the silicon substrate in the transistor. At least one of the source electrode and the drain electrode is surrounded by an auxiliary electrode connected with the gate electrode. Because a depletion layer is formed in the nitride compound semiconductor under the auxiliary electrode, a route of the leak current is shut off and the leak current between the source and drain may be effectively reduced.

8 Claims, 12 Drawing Sheets

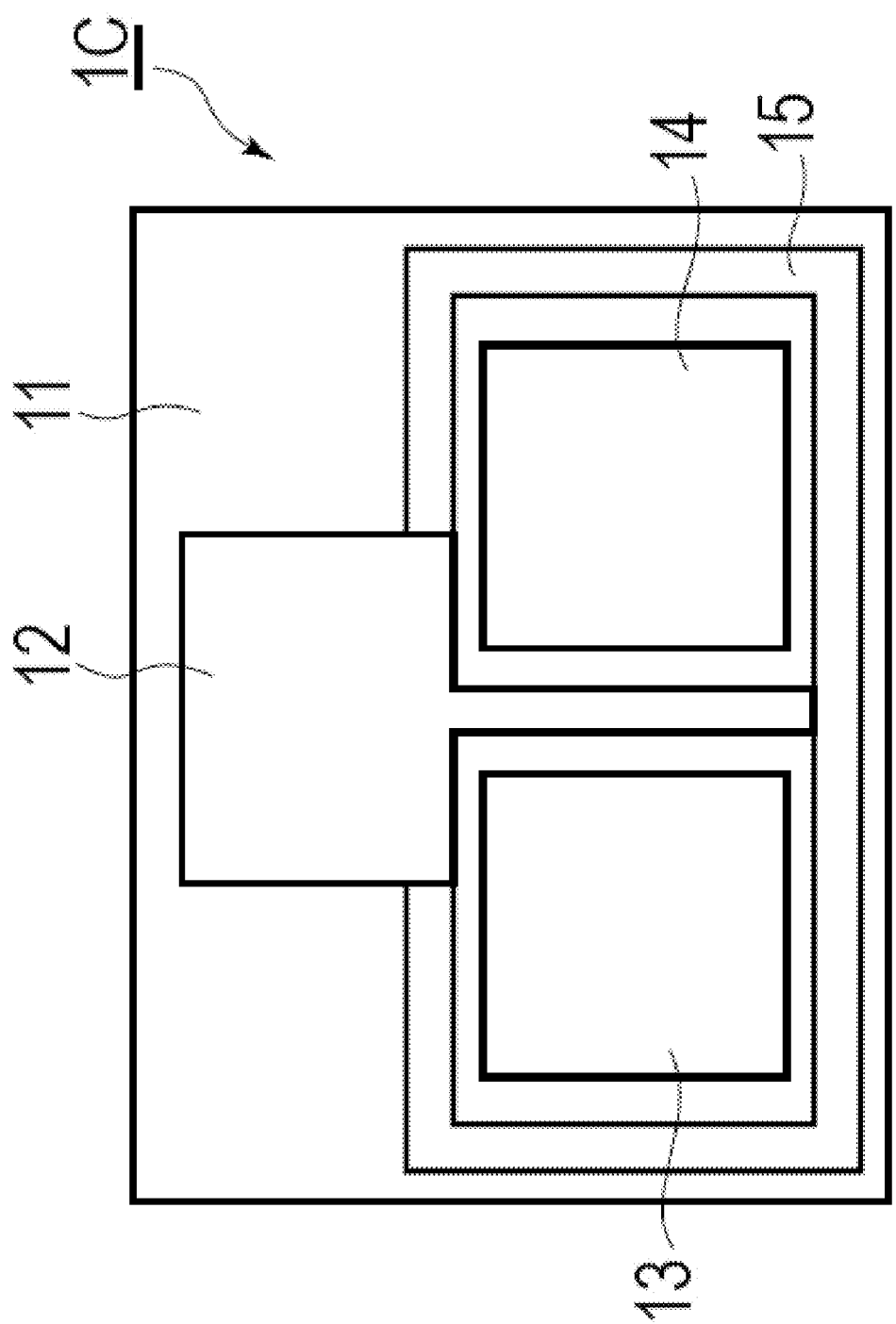

TRANSISTOR AND METHOD FOR FABRICATING THE SAME

BACKGROUND OF THE INVENTION

1. Field of the Invention

The present invention relates to a transistor using a nitride semiconductor and a method for fabricating the same.

2. Description of the Related Art

A semiconductor device using a nitride compound semiconductor such as GaN, AlGaN and others, e.g., a transistor such as a field effect transistor (FET), is being expected to be a next-generation power device. The conventional nitride compound semiconductor such as a device using the GaN semiconductor has been fabricated by using a sapphire substrate or a SiC substrate on which crystal of GaN may be readily grown.

By the way, because the substrate itself of the sapphire and SiC substrates is expensive, it is now considered to use a Si substrate whose wafer size may be enlarged and which is inexpensive. However, because a difference of coefficient of thermal expansion and a difference of lattice constant of Si with those of the nitride compound semiconductor, e.g., GaN, are large as compared to sapphire and SiC, it is difficult to grow crystals and crystallinity of the nitride compound semiconductor grown on the Si substrate is prone to be inferior as compared to that formed on the sapphire substrate for example. Due to that, there has been a problem that a leak current increases if a device such as an FET is fabricated by using the nitride compound semiconductor on the Si substrate and when high voltage is applied to the device.

As technologies for reducing the leak current in the device using the nitride compound semiconductor, Japanese Patent Application Laid-open No. 2005-183551 (Patent Document 1) forms a barrier layer between a gate electrode and a semiconductor layer by AlN whose electronic affinity is smaller than that of an electron supplying layer. Japanese Patent Application Laid-open No. 2004-247709 (Patent Document 2) includes Si in a gate electrode and interposes AL2O3 between a GaN layer and a gate electrode. Japanese Patent Application Laid-open No. 2004-186679 (Patent Document 3) discloses a technique of recovering damages caused on the surface of a compound semiconductor layer by dry etching by surface-treating by nitrogen plasma.

[Patent Document 1] Japanese Patent Application Laid-open No. 2005-183551 Gazette

[Patent Document 2] Japanese Patent Application Laid-open No. 2004-247709 Gazette

[Patent Document 3] Japanese Patent Application Laid-open No. 2004-186679 Gazette However, all of the Patent Documents 1 through 3 are what suppress the leak current in the gate electrode and the gate leak has been a problem specifically in a high-frequency FET. However, it has been found that the leak current flows also between the source and drain, in addition to the gate leak described above, when such device is used as a power device in which high voltage is applied between the source and drain. That is, if the crystallinity is inferior, e.g., the nitride compound semiconductor on the silicon substrate, and when the high voltage is applied between the source and drain, there has been a problem that the leak current flows even during when the gate electrode is turned OFF.

SUMMARY OF THE INVENTION

Accordingly, it is an object of the present invention to at least partially solve the problem in the conventional technology described above.

According to one aspect of the invention, a transistor having a gate electrode, a source electrode and a drain electrode formed respectively on the surface of a nitride compound semiconductor formed on a substrate further includes an auxiliary electrode connected with the gate electrode and surrounding at least one of the source electrode and the drain electrode.

According to another aspect of the invention, a method for fabricating the transistor having the gate electrode, the source electrode and the drain electrode on the surface of the nitride compound semiconductor formed on the substrate includes a step of forming the auxiliary electrode connected with the gate electrode and surrounding at least one of the source electrode and the drain electrode in the same time with the gate electrode.

The above and other objects, features, advantages and technical and industrial significance of this invention will be better understood by reading the following detailed description of presently preferred embodiments of the invention, when considered in connection with the accompanying drawings.

BRIEF DESCRIPTION OF DRAWINGS

FIGS. 1A, 1B and 1C are diagrammatic views showing upper surfaces of a transistor according to a first embodiment of the invention;

DETAILED DESCRIPTION OF THE PREFERRED EMBODIMENTS

Figure 1A:
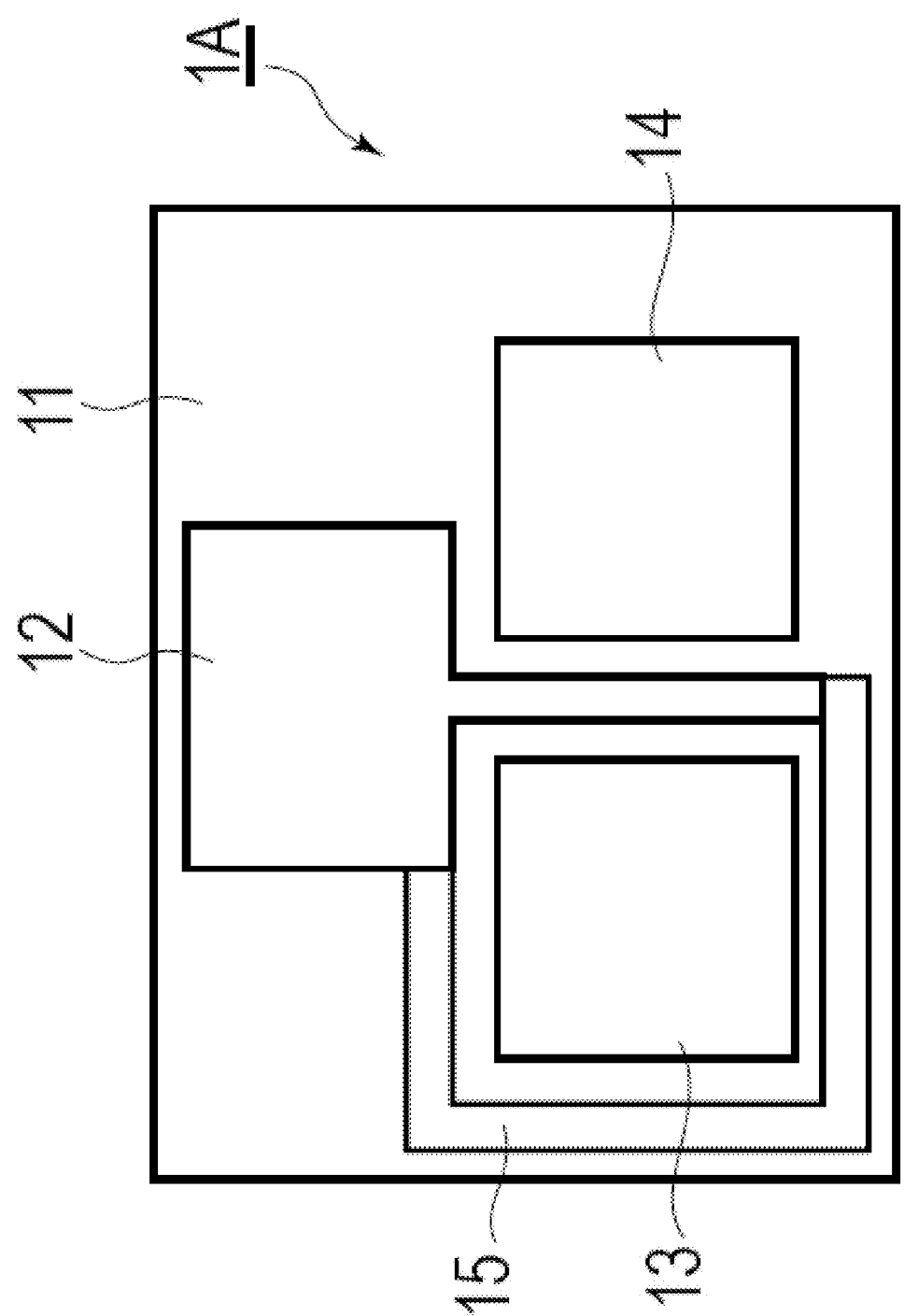

Respective embodiments embodying the present invention will be explained with reference to the drawings. It is noted that in the explanation of the respective embodiments, the same or corresponding parts will be denoted by the same reference numerals and an overlapped explanation thereof will be omitted here.

[First Embodiment]

Figure 1B:
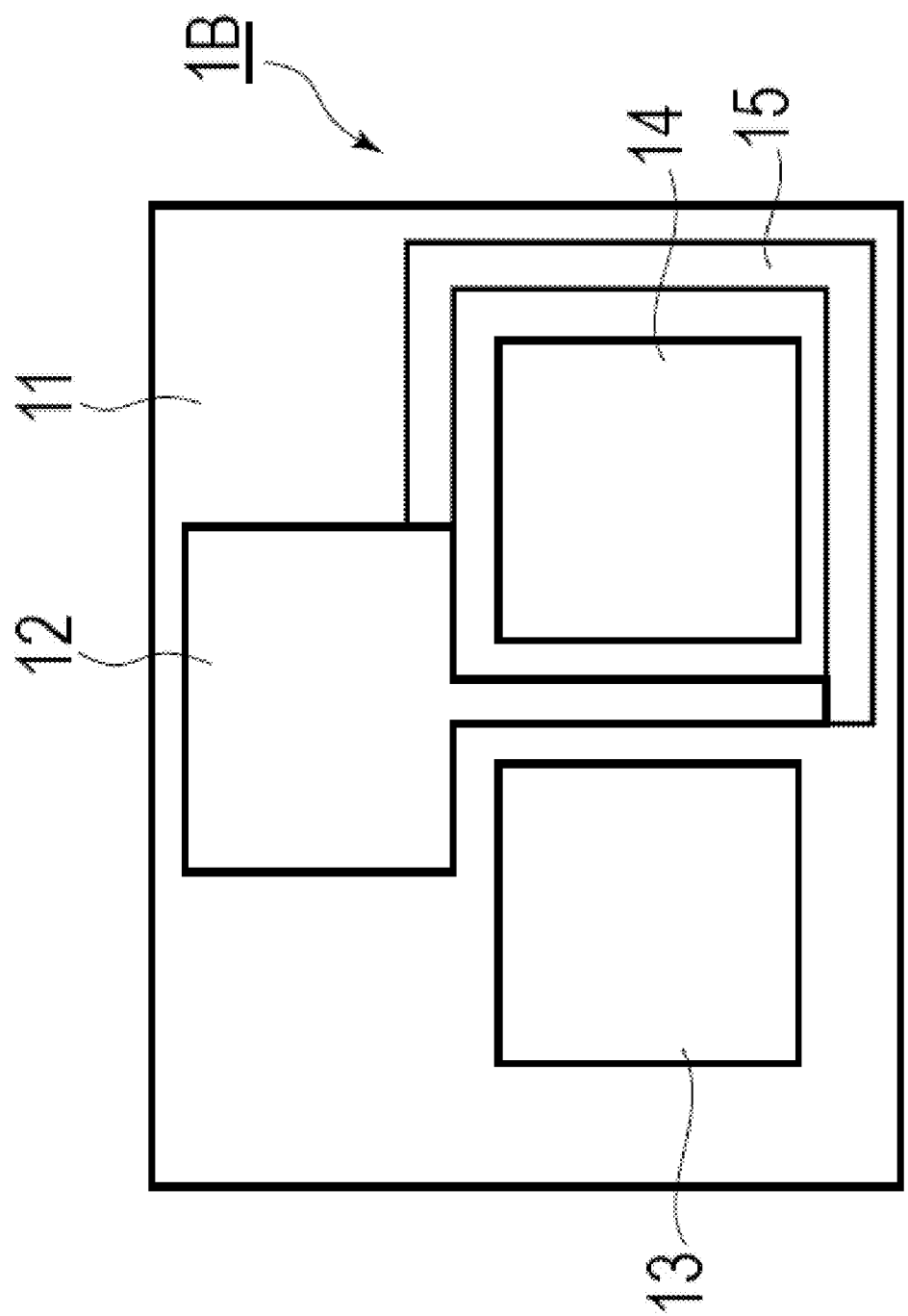

A transistor of the first embodiment of the invention will be explained. FIGS. 1A, 1B and 1C are diagrammatic views showing upper surfaces of the transistor of the first embodiment of the invention. FIGS. 1A, 1B and 1C respectively show transistors 1A, 1B and 1C in which a gate electrode 12, a source electrode 13 and a drain electrode 14 are formed on the surface of a nitride compound semiconductor layer 11 formed on a silicon substrate not shown. At least one of the source electrode 13 and the drain electrode 14 is surrounded by an auxiliary electrode 15 electrically connected with the gate electrode. FIG. 1A shows an example in which the source electrode 13 is surrounded by the auxiliary electrode 15, FIG. 1B shows an example in which the drain electrode 14 is surrounded by the auxiliary electrode 15 and FIG. 1C shows an example in which the source electrode 13 and the drain electrode 14 are surrounded by the auxiliary electrode 15, respectively.

Figure 2:
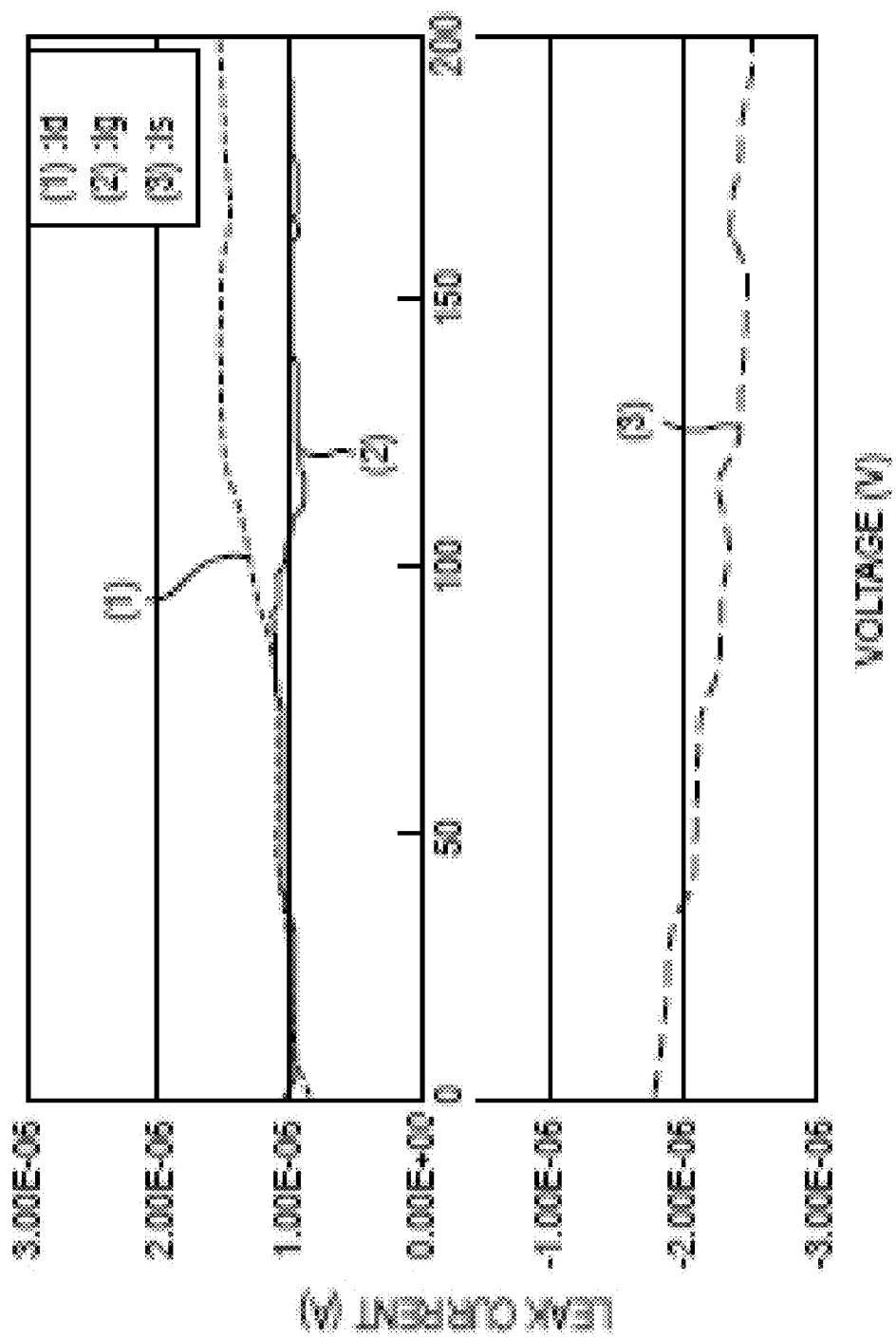
FIG. 2 is a graph showing a relationship between voltage ($V_{ds}$) between drain and source and leak currents ($I_s$, $I_g$, $I_d$) of respective electrodes of the transistor shown in FIG. 1C.

FIG. 2 is a graph showing a relationship among voltage ($V_{ds}$) between the drain and source and a leak current $I_d$ of the drain electrode, a leak current $I_g$ of the gate electrode and a leak current $I_s$ of the source electrode of the transistor 1C shown in FIG. 1C. It is noted that 3.00E-06 in the axis of ordinate of the graph denotes $3.00 \times 10^{-6}$, 2.00E-06 denotes $2.00 \times 10^{-6}$, 1.00E-06 denotes $1.00 \times 10^{-6}$, -1.00E-06 denotes $-1.00 \times 10^{-6}$, -2.00E-06 denotes $-2.00 \times 10^{-6}$ and -3.00E-06 denotes $-3.00 \times 10^{-6}$, respectively.

Figure 3:
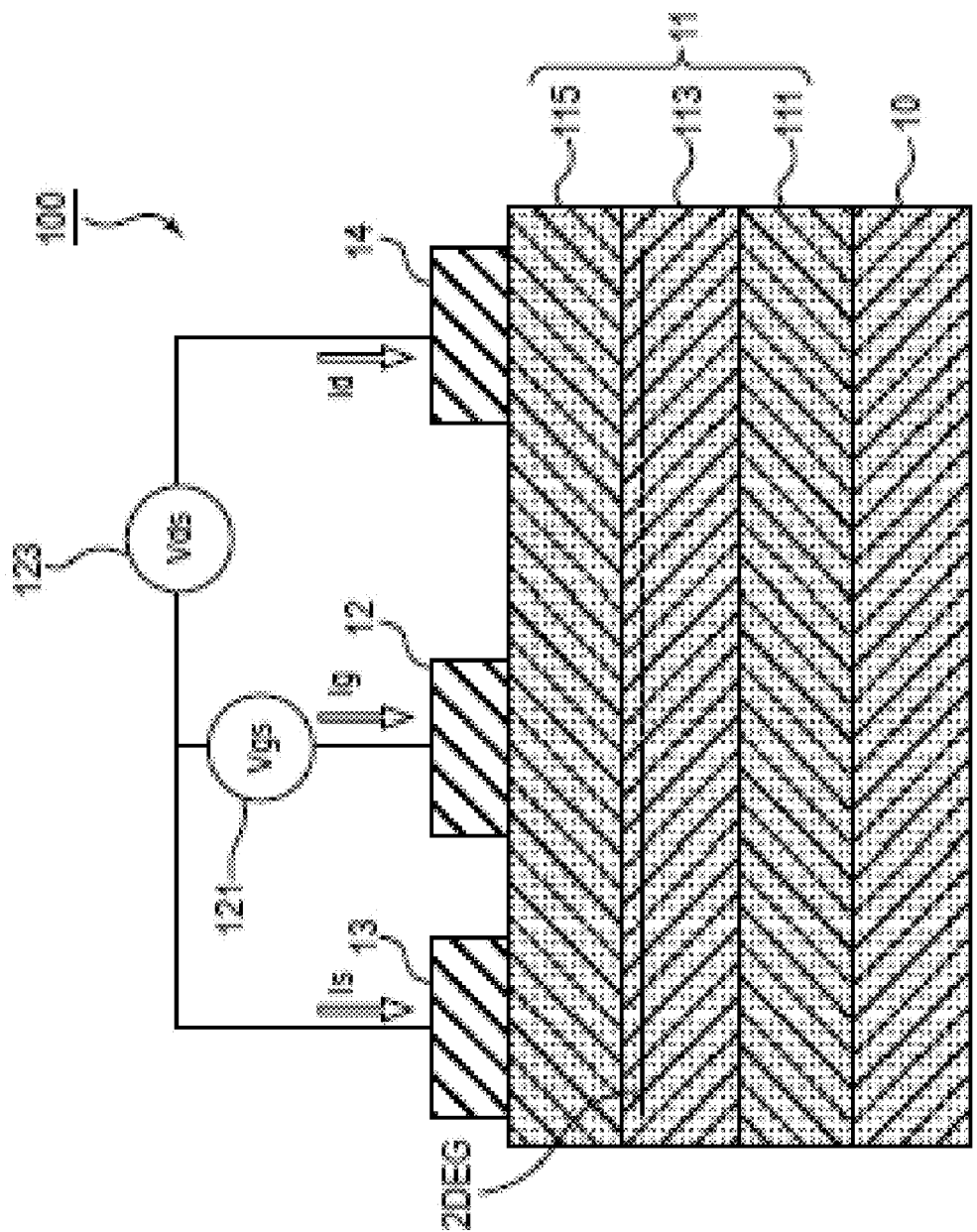
FIG. 3 is a general sectional diagrammatic view of a high electron mobility transistor (HEMT) used in the present invention.

FIG. 3 is a general sectional diagrammatic view of a high electron mobility transistor (HEMT) used in the present invention. This transistor 100 has a buffer layer 111 and an electron transit layer 113 respectively formed of nitride compound semiconductors and an electron supplying layer 115 whose band gap is greater than that of the electron transit layer 113 on a substrate 10 formed of silicon and others. The transistor 100 also has the gate electrode 12 schottky-connected with the electron supplying layer 115, the source electrode 13 and the drain electrode 14 ohmically-connected with the electron supplying layer 115 on the electron supplying layer 115. The gate electrode 12, the source electrode 13 and the drain electrode 14 are electrically connected respectively through first and second power sources 121 and 123. Due to a hetero junction structure of the electron transit layer 113 and the electron supplying layer 115, this transistor 100 has a two-dimensional electron gas (2DEG) layer having high carrier concentration and high electron mobility formed right under the junction interface and this 2DEG acts as carriers of the transistor 100.

The axis of ordinate of the graph in FIG. 2 represents directions of arrows of the leak currents ($I_s$, $I_g$, $I_d$) of the respective electrodes in FIG. 3 as positive values of the leak currents.

When the voltage between the drain and source ($V_{ds}$) is varied within a range of 0 to 200 V, the leak current ($I_d$) of the transistor 1C of the present embodiment of the invention is about 0.8 μA in maximum and favorable characteristics may be obtained, even though the leak current tends to gradually increase with the increase of the $V_{ds}$. It is presumed that such characteristics may be obtained because a depletion layer not shown is formed in the nitride compound semiconductor 11 contacting with the auxiliary electrode 15 and a route of the leak current from a domain outside of the device (domain not shut off by the gate electrode) may be shut off by surrounding the outer periphery of the source electrode 13 by the auxiliary electrode 15. It is noted that when the same test was carried out on the transistors in FIGS. 1A and 1B, values of the leak currents were substantially the same with those in the graph in FIG. 2.

Figure 4A:
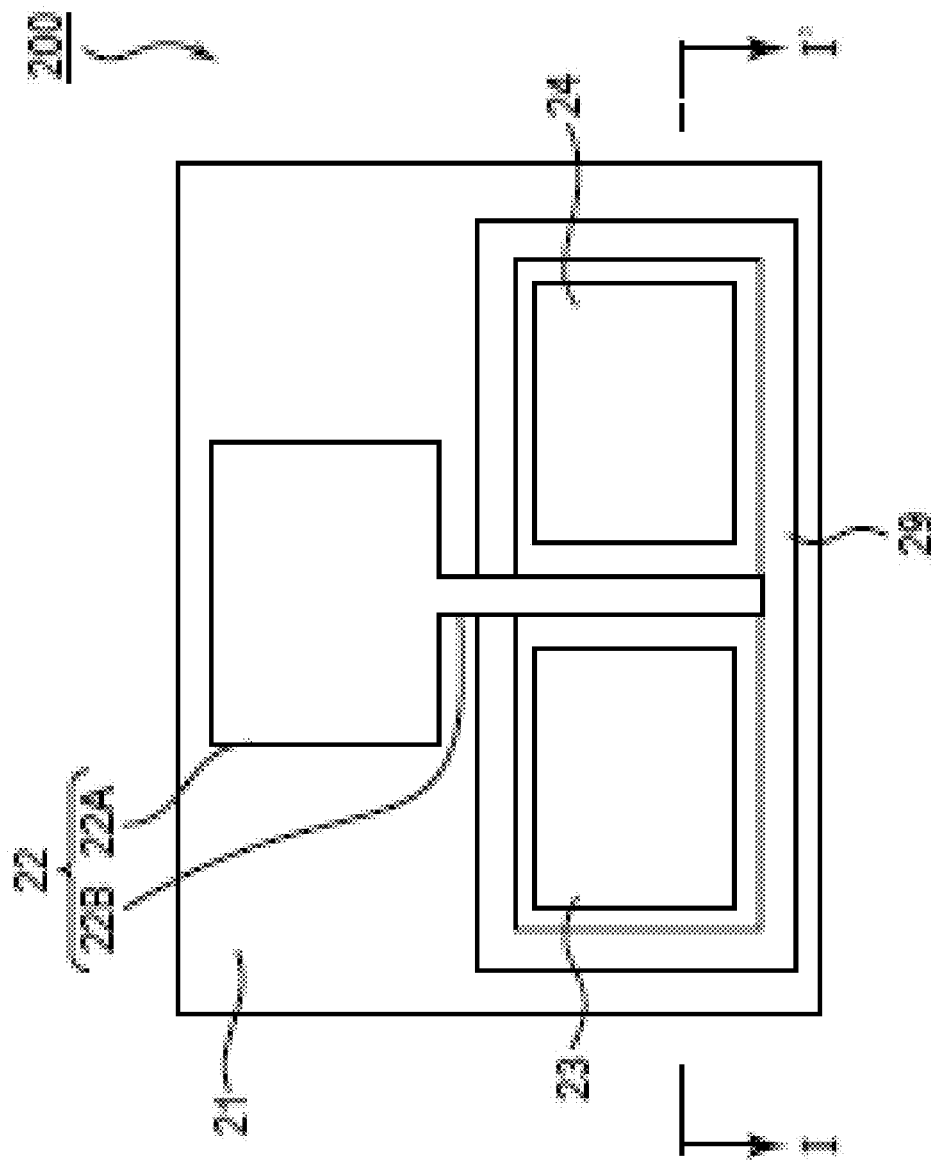
FIG. 4A is a diagrammatic view showing an upper surface of a transistor and FIG. 4B is a sectional diagrammatic view taken along a line I-I' in FIG. 4A.
Figure 4B:
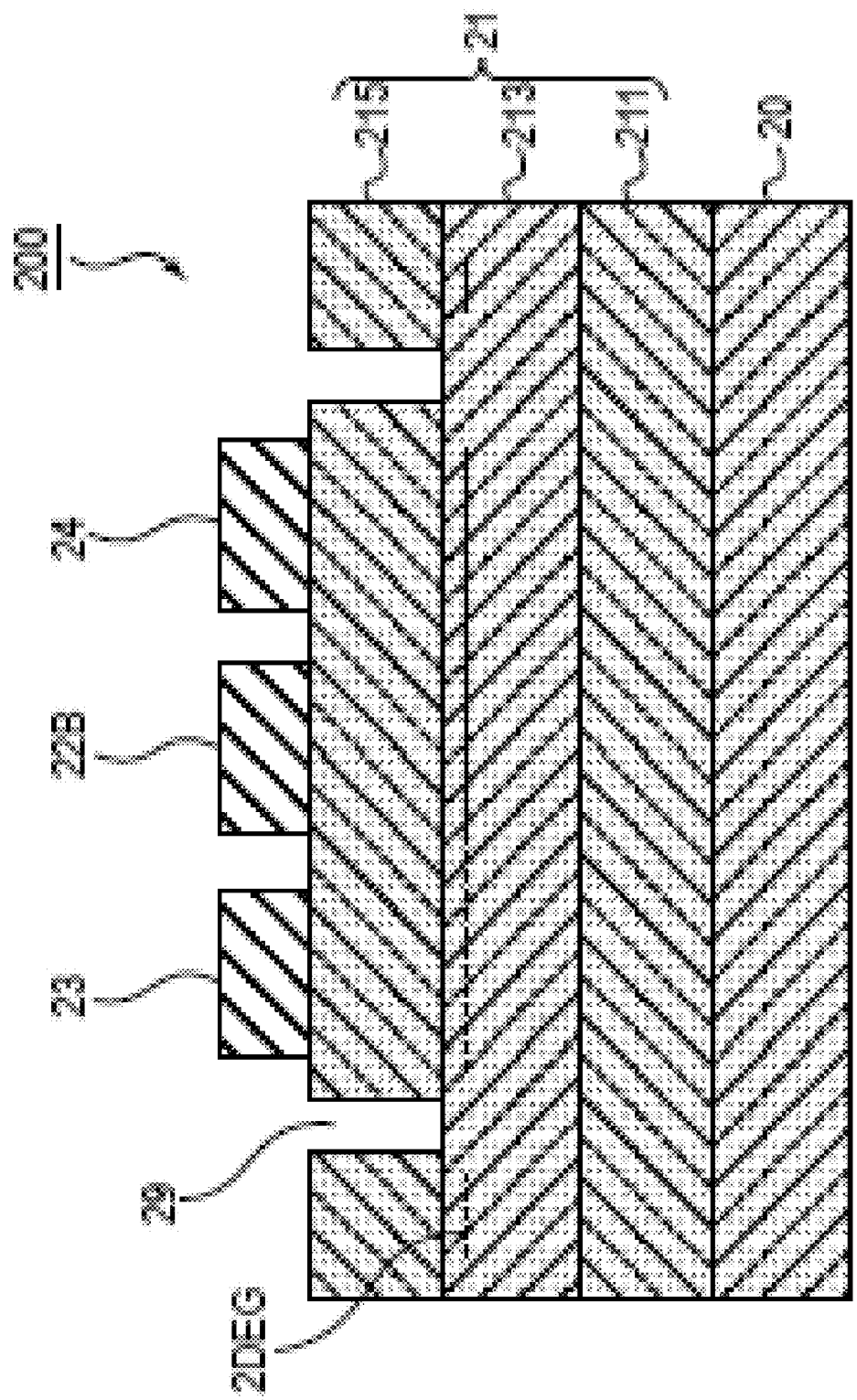

Here, a case when a finger portion of the gate electrode is disposed only between the source and drain of the transistor and no auxiliary electrode is provided will be explained for comparison. FIG. 4A is a diagrammatic view showing an upper surface of a conventional transistor and FIG. 4B is a sectional diagrammatic view taken along a line I-I' in FIG. 4A. As shown in FIG. 4A, a transistor 200 has a nitride compound semiconductor layer 21 formed on a substrate not shown and a gate electrode 22, a source electrode 23 and a 24 formed respectively on the surface of the semiconductor layer 21. While the gate electrode 22 is composed of a pad portion 22A and a finger portion 22B and the finger portion 22B is disposed between the source electrode 23 and the drain electrode 24, the transistor 200 has a groove 29 surrounding the source electrode 23 and/or the drain electrode 24 instead of the auxiliary electrode.

As shown in FIG. 4B, the transistor 200 is a HFET having a laminate structure composed of the nitride compound semiconductors similarly to the transistor 100 shown in FIG. 3. Here, instead of the auxiliary electrode, the transistor 200 has the groove 29 that reaches at least near the interface between an electron supplying layer 215 and an electron transit layer 213 from the surface of the electron supplying layer 215. Because the 2DEG layer is cut at part where the groove 29 is formed, it is possible to prevent current from flowing at part other than the gate electrode 22 and from conducting between the source and drain.

Figure 5:
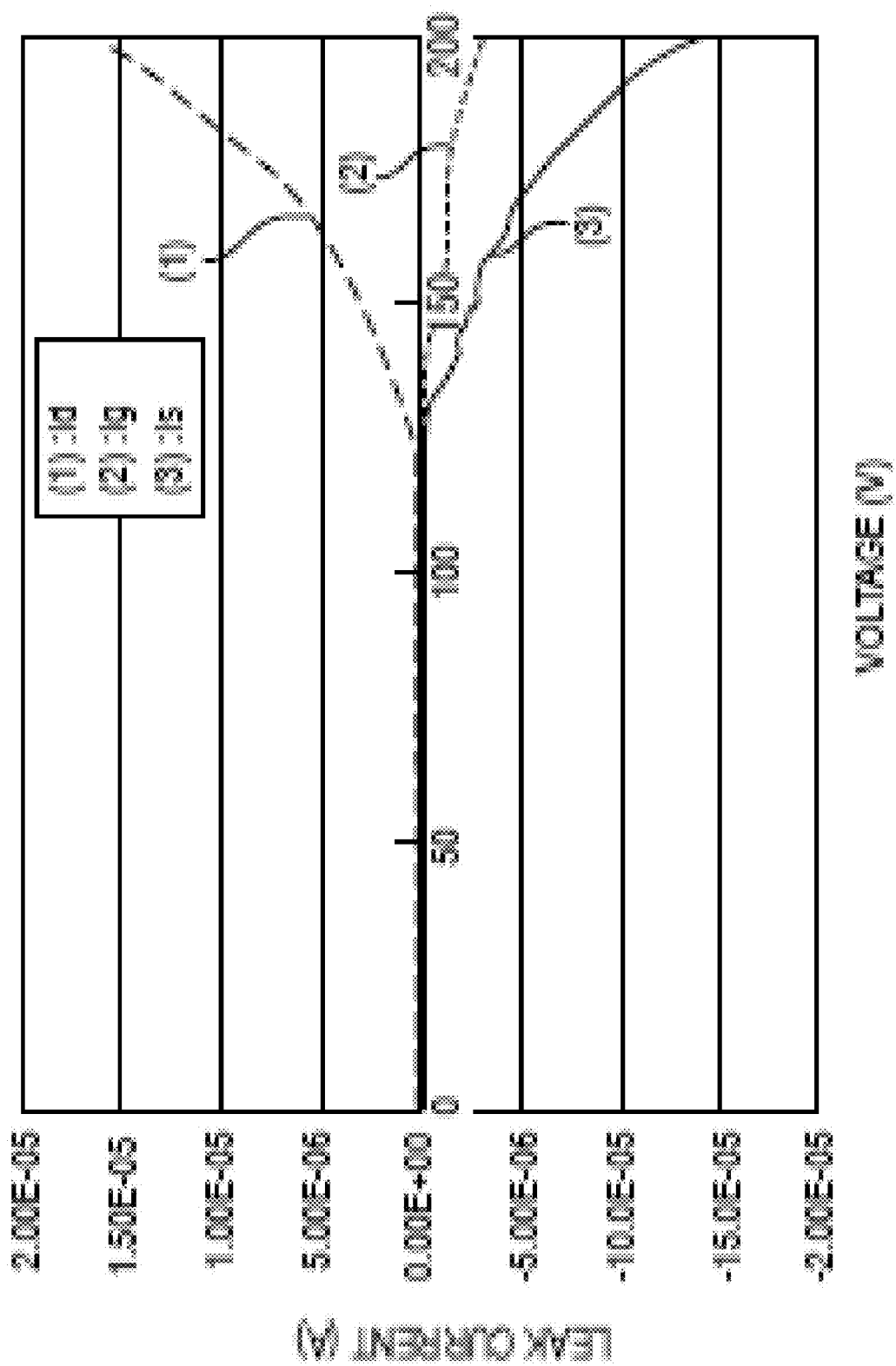
FIG. 5 is a graph showing a relationship between voltage ($V_{ds}$) between the drain and source and leak currents ($I_s$, $I_g$, $I_d$) of respective electrodes of the transistor shown in FIG. 4.

FIG. 5 is a graph showing a relationship between a voltage ($V_{ds}$) between the drain and source and leak currents ($I_s$, $I_g$, $I_d$) of the respective electrodes of the transistor 200 shown in FIG. 4. Similarly to the graph in FIG. 2, the graph in FIG. 5 shows changes of values of the respective leak currents when the voltage between the drain and source is varied in the range of 0 to 200 V.

As shown in the graph in FIG. 5, the leak current ($I_d$) of the drain electrode starts to sharply increase from around when the voltage between the drain and source exceeds 100 V and about 17 μA of leak current is generated when the voltage between the drain and source is 200 V. Still more, because the leak current ($I_s$) of the source electrode decreases with the increase of the leak current ($I_d$) of the drain electrode, it can be seen that the leak current between the drain and source passing through a route other than the route that passes through the gate electrode, e.g., the leak current passing through the electron transit layer 113 and the buffer layer 111 in FIG. 3, increases by applying high voltage between the drain and source.

That is, it is possible to shut off the route generating the leak current of the drain electrode (or of the source electrode) and to suppress the leak current effectively by surrounding the outer periphery of the source electrode 13 or the drain electrode 14 by the auxiliary electrode 15 connected with the gate electrode 12 as shown in the transistors 1A through 1C of the first embodiment of the invention.

It is noted that a short-side width of the auxiliary electrode 15 contacting with the nitride compound semiconductor layer 11 is preferable to be 0.1 μm or more in the transistor 100 of the first embodiment of the invention shown in FIG. 1. It is possible to form the depletion layer of the nitride compound semiconductor under the auxiliary electrode 15 to a predetermined depth and to suppress the leak current more effectively by setting the value of the width of the auxiliary electrode 15 as described above. When the width of the auxiliary electrode 15 is narrower than 0.1 μm, the effect of shutting off the leak current decreases due to a short-channel effect.

Still more, if the width of the auxiliary electrode 15 is larger than 100 μm, a chip area is remarkably increased, so that it is preferable to be less than 100 μm.

Further, if the thickness of the auxiliary electrode 15 is thinner than or equal to that of the finger portion of the gate electrode 12, resistance of the auxiliary electrode 15 relatively increases and a time constant increases, so that a time until when the whole auxiliary electrode 15 reaches a predetermined voltage (the same voltage with that of the gate electrode) since when the voltage is applied to the gate electrode 12 becomes longer in a part distant from the pad portion of the gate electrode as compared to a part close to the pad portion. There is a possibility that the leak current is generated and the device is broken down by this time lag in the state when high voltage is applied between the drain and source. This time lag may be reduced by lowering the resistance of the auxiliary electrode 15 and to that end, it is preferable to increase an area of a cross-section of the auxiliary electrode 15 more than that of the finger portion composing the gate electrode. It is noted the cross-section of the auxiliary electrode 15 may be appropriately set corresponding to the short-side width, length and others.

[Second Embodiment]

Figure 6:
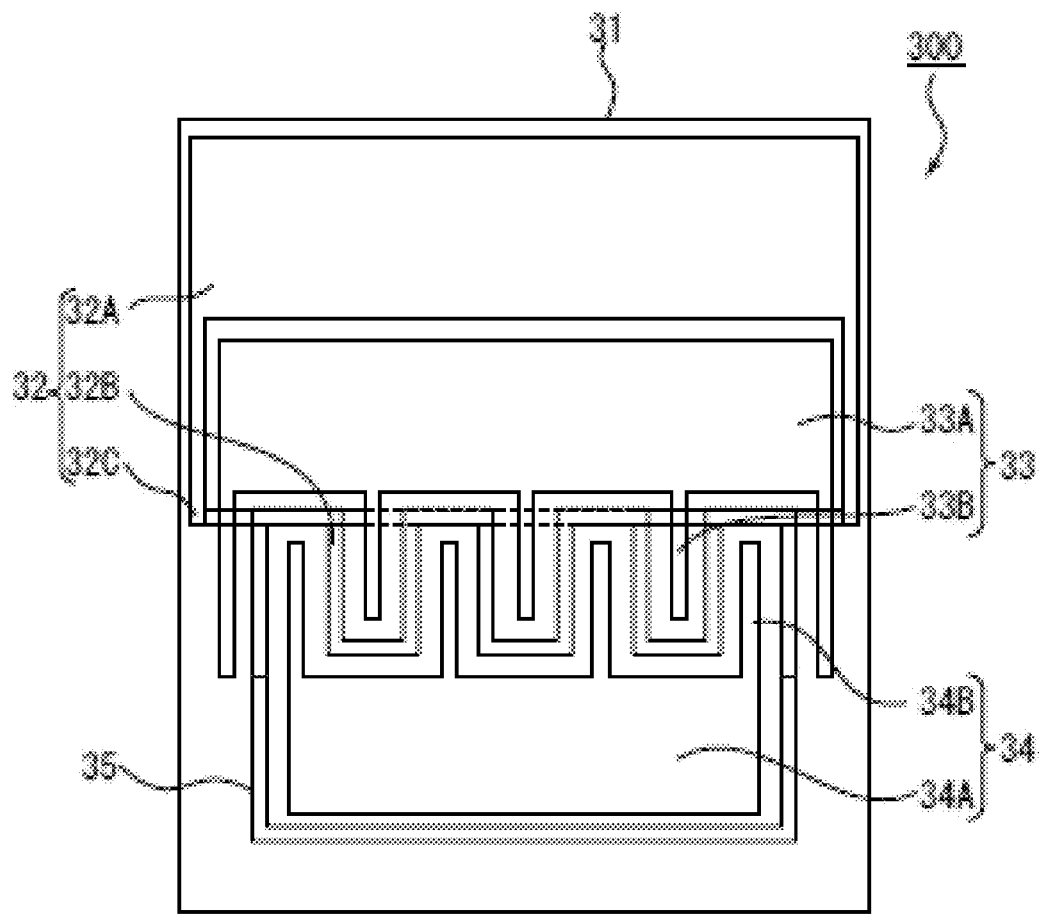
FIG. 6 is a diagrammatic view of an upper surface of a transistor according to a second embodiment of the invention.

Next, a transistor of a second embodiment of the invention will be explained. FIG. 6 is a diagrammatic view of an upper surface of the transistor 300 of the second embodiment of the invention. In FIG. 6, the transistor 300 has a gate electrode 32, a source electrode 33 and a drain electrode 34 formed respectively on the surface of a nitride compound semiconductor layer 31 formed on a substrate not shown. The gate electrode 32 has a pad portion 32A and a finger portion 32B. The source electrode 33 has a pad portion 33A and a finger portion 33B. The drain electrode 34 also has a pad portion 34A and a finger portion 34B.

In the present embodiment, the outer periphery of the drain electrode 34 is surrounded by the gate electrode 32 and an auxiliary electrode 35 connected with the gate electrode 32. It is noted that a portion of a broken line of the gate electrode 32 in FIG. 6 is a connecting portion 32C where portions of the finger portions 32B of the gate electrode are connected and the finger portion 32B of the gate electrode and the pad portion 32A of the gate electrode are connected and lies on the finger portion 33B of the source electrode through an insulating film not shown.

Figure 7:
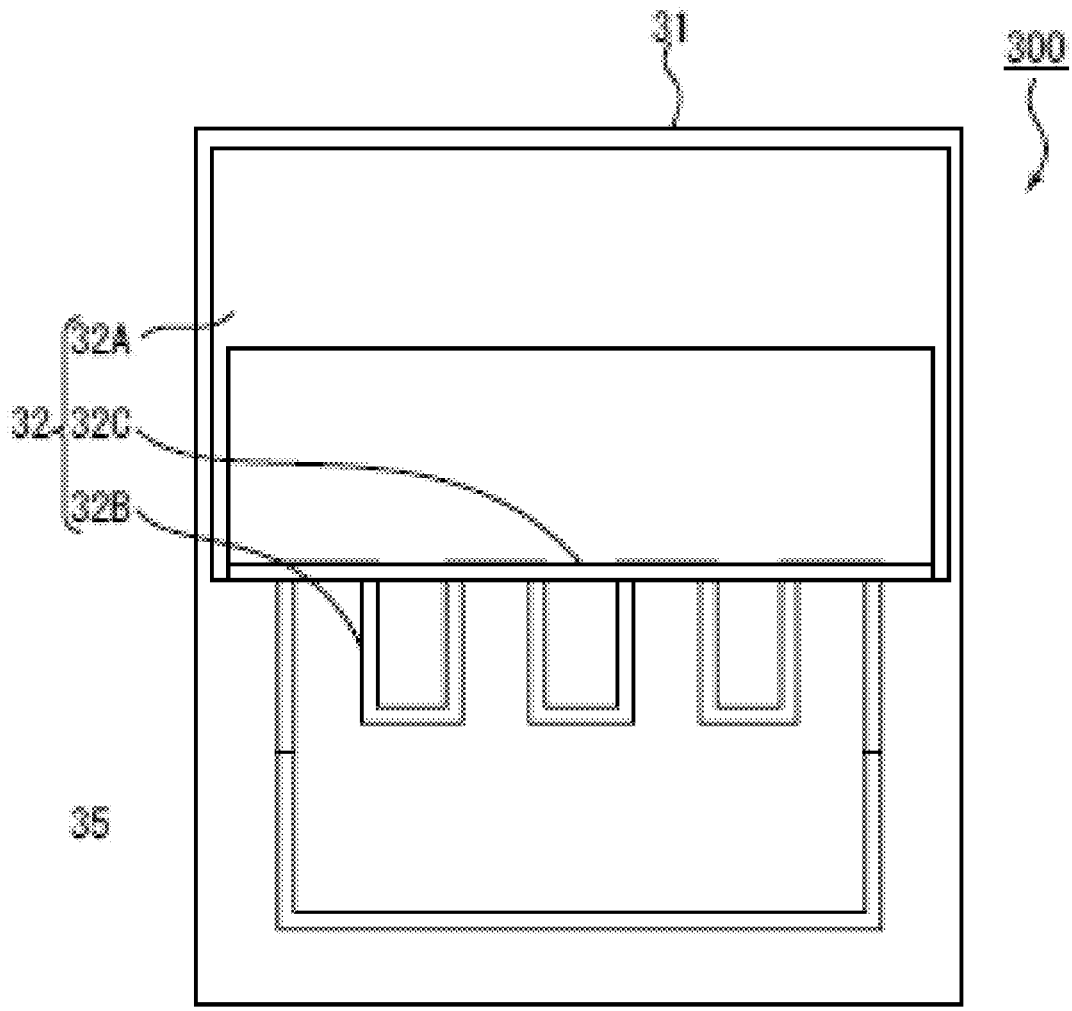
FIG. 7 is a diagrammatic view of an upper surface of a gate electrode portion of the transistor of the second embodiment of the invention.

FIG. 7 is a diagrammatic view of an upper surface of the gate electrode portion of the transistor of the second embodiment of the invention. In FIG. 7, the gate electrode 32 has the pad portion 32A, the finger portion 32B and the connecting portion 32C where the finger portions 32B are connected and the finger portion 32B and the pad portion 32A are connected as described above. The transistor 300 of the present embodiment also has the auxiliary electrode 35 that is electrically connected with the gate electrode 32 and surrounds the outer periphery of the drain electrode not shown as described above.

Here, it is preferable to form the auxiliary electrode 35 and the connecting portion 32C to be thicker than the finger portion 32B and to form parts other than the finger portion 32B to be thick.

[Third Embodiment]

Figure 8A:
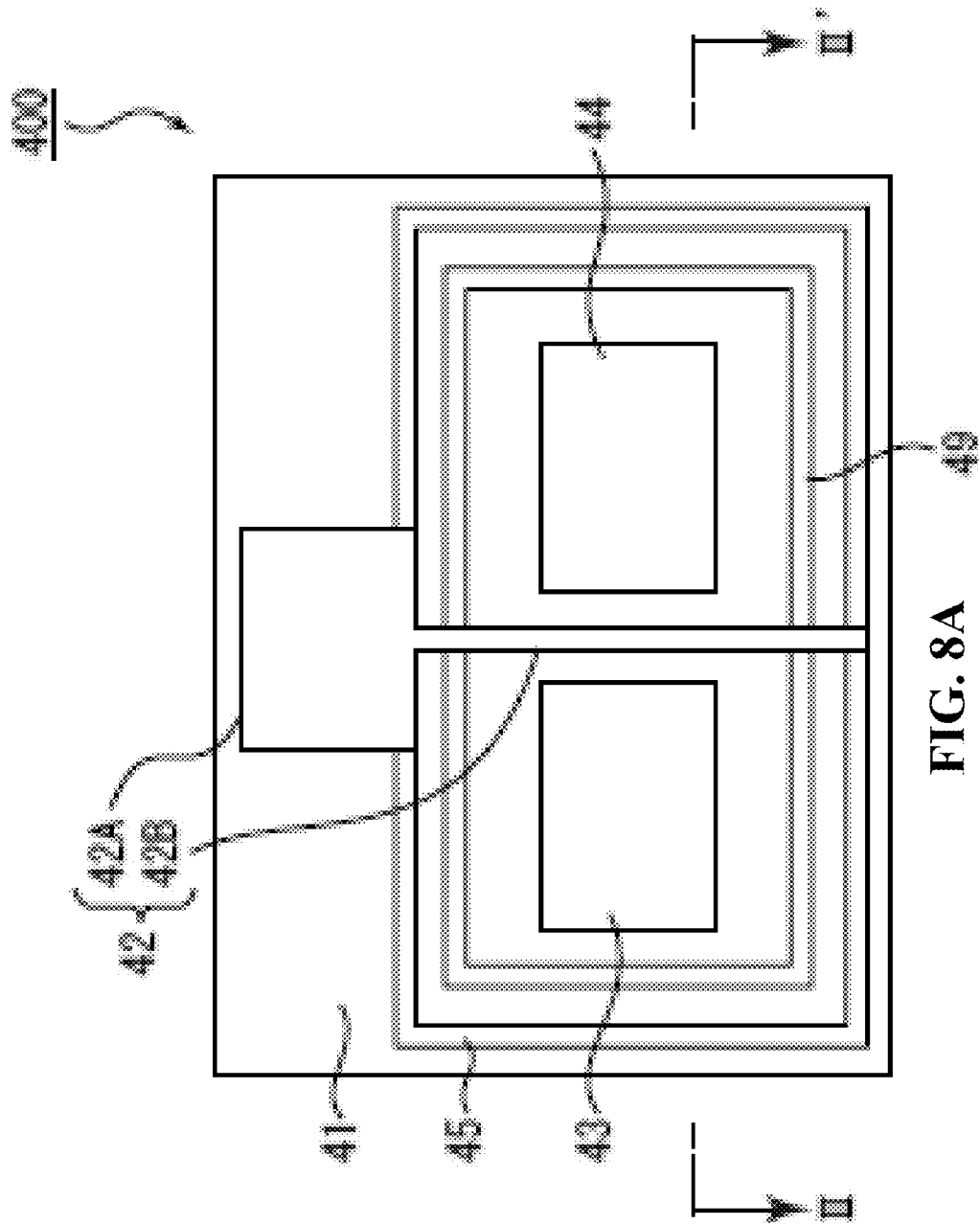
FIG. 8A is a diagrammatic view of an upper surface of a transistor according to a third embodiment of the invention and FIG. 8B is a section view taken along a line II-II' in FIG. 8A.
Figure 8B:
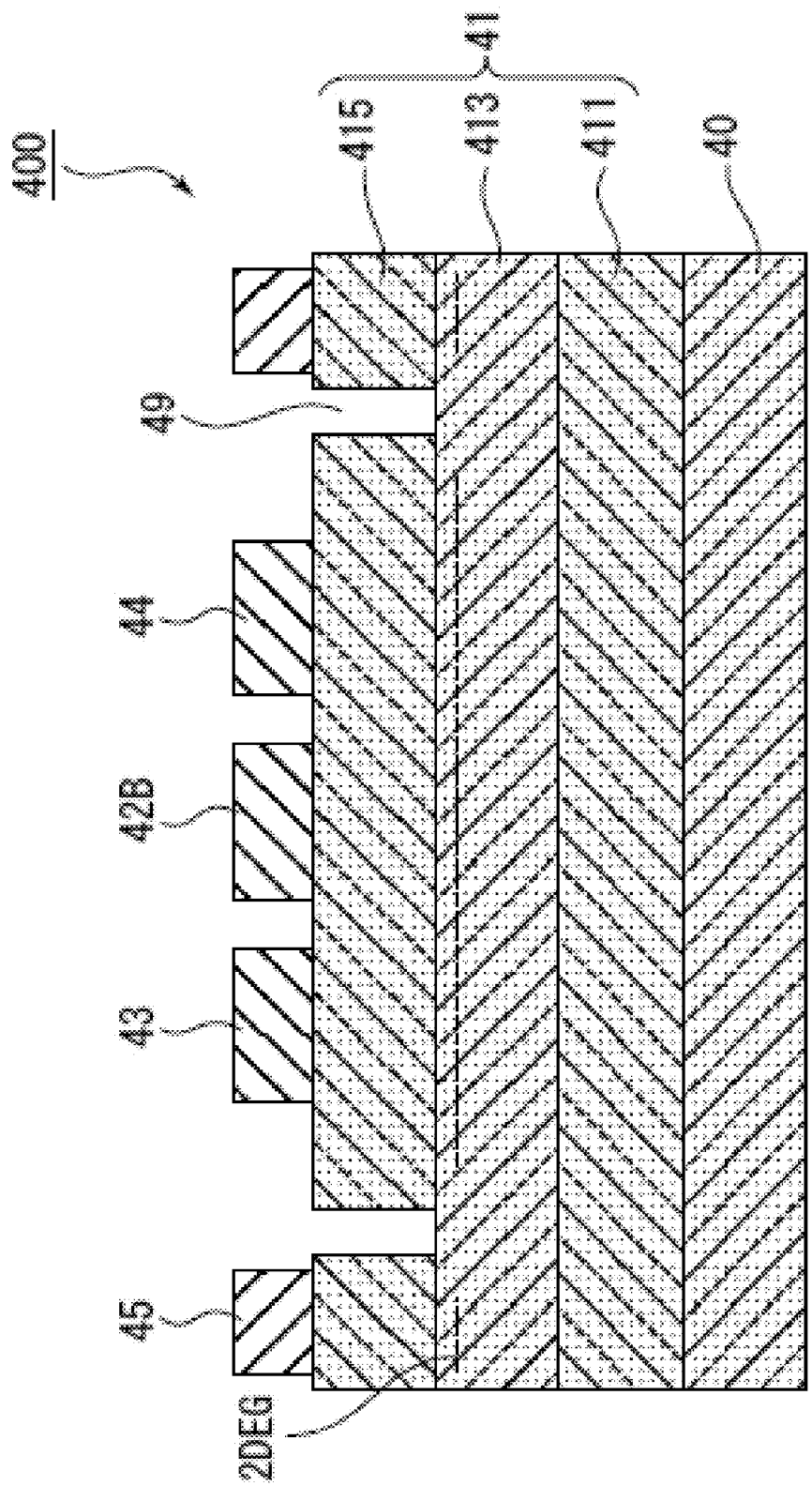

Next, a transistor according to a third embodiment of the invention will be explained. FIG. 8A is a diagrammatic view of an upper surface of the transistor of the third embodiment of the invention and FIG. 8B is a section view taken along a line II-IF in FIG. 8A. As shown in FIG. 8A, a source electrode 43 and a drain electrode 44 of the transistor 400 are surrounded respectively by an auxiliary electrode 45 connected with a gate electrode 42 in the same manner with the transistor 1C shown in FIG. 1C. Further, as shown in FIG. 8B, the transistor 400 has a nitride compound semiconductor layer 41 including a buffer layer 411, an active layer 413 and an electron supplying layer 415 formed sequentially on a substrate 40. Here, the transistor 400 also has a groove 49 surrounding the source electrode 43 and the drain electrode 44 and reaching near the interface between the active layer 413 and the electron supplying layer 415 from the surface of the electron supplying layer 415.

Due to the groove 49, no 2DEG layer is formed around the source electrode 43 and the drain electrode 44, except of that under the gate electrode 42, and thereby, it becomes possible to prevent a current from conducting between the source and drain through the 2DEG layer. Still more, it is possible to suppress the leak current between the source and drain further because the leak current passing through a route other than the route passing through the 2DEG layer may be reduced by the auxiliary electrode 45.

While the preferred embodiments of the invention have been described above, the embodiment of the invention is not limited to those embodiments described above and it is needless to say that the embodiment may be appropriately modified within a range of technological matters described in a scope of Claims.

Still more, the invention is not limited specifically to the concrete structure of the transistor composed of the nitride compound semiconductor and may be applied to various transistors such as a high electron mobility transistor (HEMT), a junction gate FET (JFET) and a metal oxide semiconductor FET (MOSFET).

The transistor of the invention is capable of reducing the leak current between the source electrode and the drain electrode formed on the surface of the nitride compound semiconductor because the outer periphery of at least one of the source electrode and the drain electrode is surrounded by the auxiliary electrode connected with the gate electrode. Still more, according to a method for fabricating the transistor of the invention, the auxiliary electrode may be formed in the same time with the gate electrode, so that it is not necessary to add a new processing step and it is possible to cut a cost for fabricating the transistor in which the nitride compound semiconductor transistor is formed on the silicon substrate.

Although the invention has been described with respect to the specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A transistor, comprising:
   a gate electrode, a source electrode and a drain electrode formed respectively on the surface of a nitride compound semiconductor;
   said transistor further comprising an auxiliary electrode connected with said gate electrode and surrounding at least one of said source electrode and said drain electrode.

2. The transistor according to claim 1, wherein a width of a part of said auxiliary electrode contacting with said nitride compound semiconductor is in a range from 0.1 μm to 100 μm.

3. The transistor according to claim 1, wherein said gate electrode has a pad portion and a finger portion; and
   an area of a cross-section of said auxiliary electrode is larger than an area of a cross-section of said finger portion of said gate electrode.

4. The transistor according to claim 1, further comprising:
   an electron transit layer of a nitride compound semiconductor; and
   an electron supplying layer on the electron transit layer, a band gap of the electron supplying layer being greater than that of the electron transit layer,
   wherein the gate electrode and the auxiliary electrode surround at least one of the source electrode and the drain electrode.

5. A transistor, comprising:
a channel layer composed of a nitride compound semiconductor formed on said substrate;
an electron supplying layer composed of a nitride compound semiconductor whose band gap energy is greater than that of said channel layer and formed on said channel layer to form a two-dimensional electron gas in said channel layer; and
a gate electrode, a source electrode and a drain electrode formed respectively on said electron supplying layer;
said transistor further comprising a groove formed around at least one of said source electrode and said drain electrode and reaching said channel layer from the surface of said electron supplying layer.

6. A method for fabricating a transistor comprising a gate electrode, a source electrode and a drain electrode formed on the surface of a nitride compound semiconductor formed on a substrate, comprising a step of:
forming an auxiliary electrode connected with said gate electrode and surrounding at least one of said source electrode and said drain electrode.

7. The method for fabricating the transistor according to claim 6, wherein the transistor comprises an electron transit layer of a nitride compound semiconductor and an electron supplying layer whose band gap is greater than that of the electron transit layering, and wherein
the gate electrode, the source electrode and the drain electrode are formed on the surface of the electron supplying layer, and the gate electrode and the auxiliary electrode surround at least one of the source electrode and the drain electrode.

8. A method for fabricating a transistor, comprising steps of:
forming a channel layer composed of a nitride compound semiconductor and an electron supplying layer composed of a nitride compound semiconductor whose band gap energy is greater than that of said channel layer on a substrate;
forming a gate electrode, a source electrode and a drain electrode respectively on said electron supplying layer; and
forming a groove that reaches said channel layer from the surface of said electron supplying layer around periphery of at least one of said source electrode and said drain electrode.

* * * * *